(12) United States Patent
Chrisman et al.

(10) Patent No.: US 8,575,022 B2
(45) Date of Patent: Nov. 5, 2013

(54) TOP CORNER ROUNDING OF DAMASCENE WIRE FOR INSULATOR CRACK SUPPRESSION

(75) Inventors: Gregory S. Chrisman, Essex Junction, VT (US); Edward C. Cooney, III, Jericho, VT (US); Jeffrey P. Gambino, Westford, VT (US); Zhong-Xiang He, Essex Junction, VT (US); Thomas L. McDevitt, Underhill, VT (US); Eva A. Shah, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/304,772

(22) Filed: Nov. 28, 2011

(65) Prior Publication Data
US 2013/0133919 A1 May 30, 2013

(51) Int. Cl.
*H01L 21/4763* (2006.01)
*H01L 21/44* (2006.01)

(52) U.S. Cl.
USPC ............................ 438/633; 438/666; 438/669

(58) Field of Classification Search
None
See application file for complete search history.

(56) References Cited

U.S. PATENT DOCUMENTS

| | | | |
|---|---|---|---|
| 5,244,534 A * | 9/1993 | Yu et al. ....................... | 438/672 |
| 5,892,285 A * | 4/1999 | Gonzalez et al. ............. | 257/763 |
| 6,033,984 A * | 3/2000 | Schnabel et al. .............. | 438/638 |
| 6,387,807 B1 | 5/2002 | Faubert et al. | |
| 6,960,519 B1 * | 11/2005 | Dalton et al. ................. | 438/617 |
| 7,125,791 B2 | 10/2006 | Liu | |
| 7,291,557 B2 * | 11/2007 | Wan et al. ..................... | 438/687 |
| 7,399,706 B2 | 7/2008 | Omoto et al. | |
| 7,514,792 B2 * | 4/2009 | Hasegawa ..................... | 257/758 |
| 7,666,782 B2 | 2/2010 | Fujiki | |
| 7,767,583 B2 | 8/2010 | Ramappa et al. | |
| 2005/0085050 A1* | 4/2005 | Draney et al. ................. | 438/459 |
| 2005/0176241 A1* | 8/2005 | Ryu .............................. | 438/633 |
| 2005/0253266 A1* | 11/2005 | Tsumura et al. .............. | 257/758 |
| 2009/0286392 A1 | 11/2009 | Masuda et al. | |
| 2011/0024907 A1* | 2/2011 | Fujiyama ....................... | 257/751 |
| 2011/0278063 A1* | 11/2011 | Chen et al. ................... | 174/94 R |
| 2012/0187516 A1* | 7/2012 | Sato ............................. | 257/443 |

FOREIGN PATENT DOCUMENTS

WO      WO 03046956      6/2003

* cited by examiner

*Primary Examiner* — Evan Pert
*Assistant Examiner* — Andres Munoz
(74) *Attorney, Agent, or Firm* — Gibb & Riley, LLC; Richard M. Kotulak, Esq.

(57) ABSTRACT

A structure and method for fabricating the structure that provides a metal wire having a first height at an upper surface. An insulating material surrounding said metal wire is etched to a second height below said first height of said upper surface. The metal wire from said upper surface, after etching said insulating material, is planarized to remove sufficient material from a lateral edge portion of said metal wire such that a height of said lateral edge portion is equivalent to said second height of said insulating material surrounding said metal wire.

22 Claims, 6 Drawing Sheets

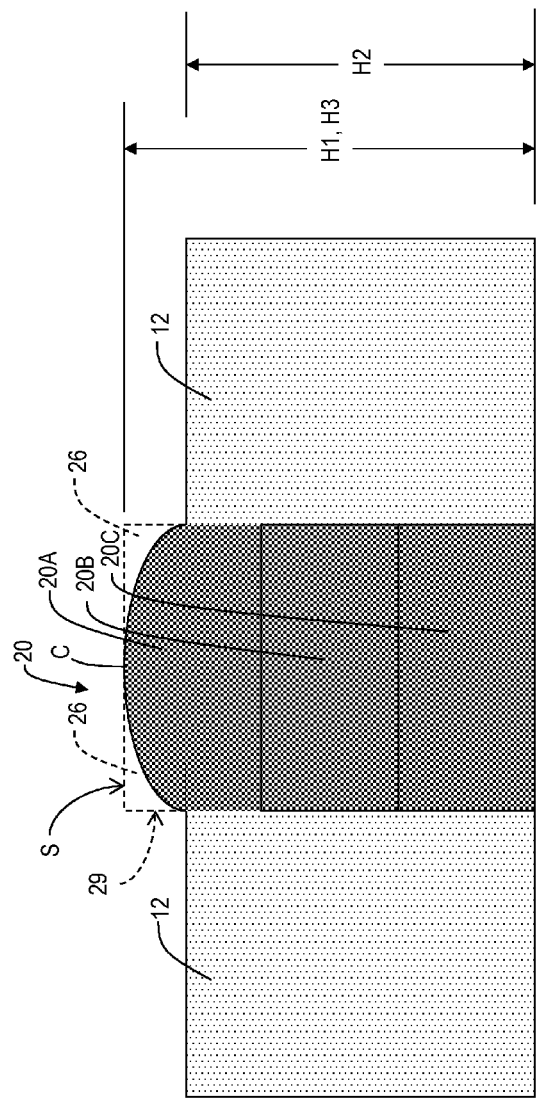
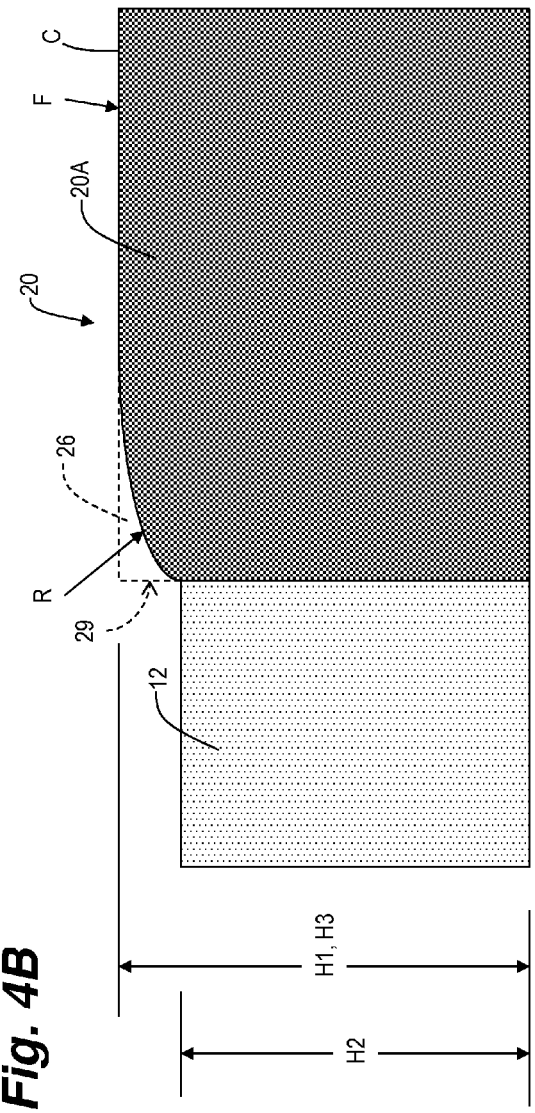
Fig. 4A
Fig. 4B

TOP CORNER ROUNDING OF DAMASCENE WIRE FOR INSULATOR CRACK SUPPRESSION

BACKGROUND

1. Field of the Invention

The present invention generally relates to a method and corresponding structure that prevents insulator cracking at a corner or edge of a non-planar damascene metal wire.

2. Background

Insulator cracking at the corner or edge of non-planar damascene wire is a common problem in semiconductor fabrication where the metal wire inductor structures are relatively thick, (>3 microns), and the surrounding adjacent insulating materials, (e.g., silicon dioxide, $SiO_2$), are relatively brittle. Since the metal inductors and corresponding insulators have a significant mismatch in their coefficient of thermal expansion, e.g., a copper (Cu) inductor may have a coefficient of thermal expansion of approximately twenty (20) times that of the coefficient of thermal expansion of a $SiO_2$ insulator, the mismatch in coefficients of thermal expansion typically causes the more brittle insulator to crack at stress risers located on the inductor. These stress risers are usually located at corner portions of the metal inductors that occur at discrete layers of a damascene metal structure during the fabrication of the entire non-planar damascene metal inductor.

Advanced analog and mixed-signal applications require these metal inductor layers and are typically fabricated in matching networks for very high frequency applications. However, for high quality inductors with low resistive losses, the inductor thickness is typically much greater than interconnect wiring. Thus, to achieve the design requirements of low resistive losses, the metal damascene inductors are relatively large in size with respect to the surrounding insulator material, and therefore, have a higher propensity of causing cracking due to stress build-up between the two thermally-mismatched materials.

BRIEF SUMMARY

According to one example, a method herein provides a metal wire having a first height at an upper surface. An insulating material surrounding the metal wire is etched to a second height below the first height of the upper surface. The metal wire from the upper surface is planarized, after etching the insulating material, to remove sufficient material from a lateral edge portion of the metal wire such that a height of the lateral edge portion is equivalent to the second height of the insulating material surrounding the metal wire. A central portion of the metal wire, opposite the lateral edge portion, extends to a third height above the second height.

According to another example, another method provides planarizing a metal wire to a first height at an upper surface. An oxide material surrounding the metal wire is etched to a second height below the first height at the upper surface. The metal wire is planarized at the upper surface, after the etching the oxide material, to remove sufficient material from a lateral edge portion of the metal wire such that a height of the lateral edge portion is equivalent to the second height of the oxide material surrounding the metal wire. A central portion of the metal wire, opposite the lateral edge portion, extends to a third height above the second height.

According to another example, a structure provides a metal wire having a first height at a central portion, a second height at a first distal edge less than the first height, and a radius defined from the second height at the first distal edge to the first height at the central portion. In addition, an insulating material surrounds the metal wire to the second height at the first distal edge of the metal wire. The first height of the metal wire extends above the second height of the first distal edge and the insulating material.

According to another example, a structure provides a non-planar damascene metal wire having a first height at a central portion, a second height at a first distal edge less than the first height, and a radius defined from the second height at the first distal edge to the first height at the central portion. In addition, an oxide material surrounds the non-planar metal wire to the second height at the first distal edge of the metal wire. The first height of the non-planar damascene metal wire extends above the second height of the first distal edge and the oxide material.

With these features, the embodiments herein may provide a structure and method of providing the structure that produces a radius where a corner portion of a non-planar metal damascene wire used to be by a secondary soft-pad chemical mechanical planarization process to eliminate the stress raiser of the sharp corner portion of the metal inductor formed though a previous fabrication process.

BRIEF DESCRIPTION OF THE SEVERAL VIEWS OF THE DRAWINGS

The foregoing and other exemplary purposes, aspects and advantages will be better understood from the following detailed description of an exemplary embodiment herein with reference to the drawings.

FIG. 4A is a cross sectional view of a schematic diagram of the embodiment illustrating a process of CMP material removal of an edge portion of the non-planar damascene metal wire proximate the insulator material;

FIG. 4B is an alternative embodiment of the cross sectional view of FIG. 4A illustrating an alternative profile of CMP material removal of the edge portion of the non-planar damascene metal wire;

DETAILED DESCRIPTION

Figure 1A:
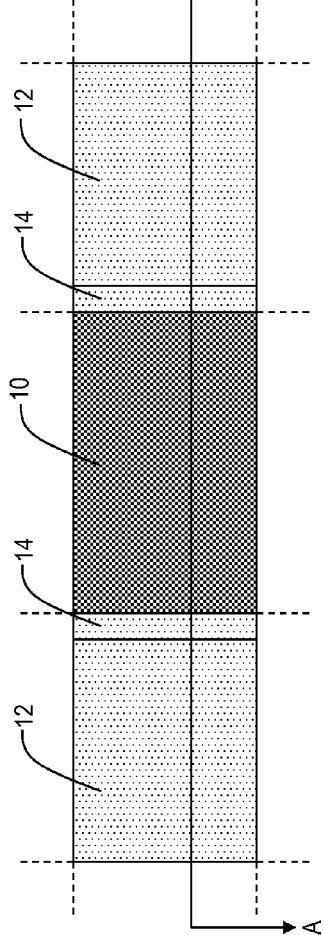
FIG. 1A is a top view of a schematic diagram of a cracked insulator material proximate a non-planar damascene metal wire.

Referring now to the drawings, and more particularly to FIGS. 1A-6, there are shown exemplary embodiments of the method and structures of the embodiments herein.

FIG. 1A is a top view of a schematic diagram of a cracked insulating material proximate a non-planar damascene metal wire. A crack 14 is propagated in an insulating material 12 proximate a non-planar damascene metal wire 10 typical of a mismatched coefficient of thermal expansion between the two materials. For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance. The metal wires mentioned herein can be formed of any conductive metal, such as copper, aluminum, tungsten, hafnium, tantalum, molybdenum, titanium, or nickel, or a metal silicide, any alloys of such metals, and may be deposited using physical vapor deposition, chemical vapor deposition, or any other technique known in the art.

Figure 1B:
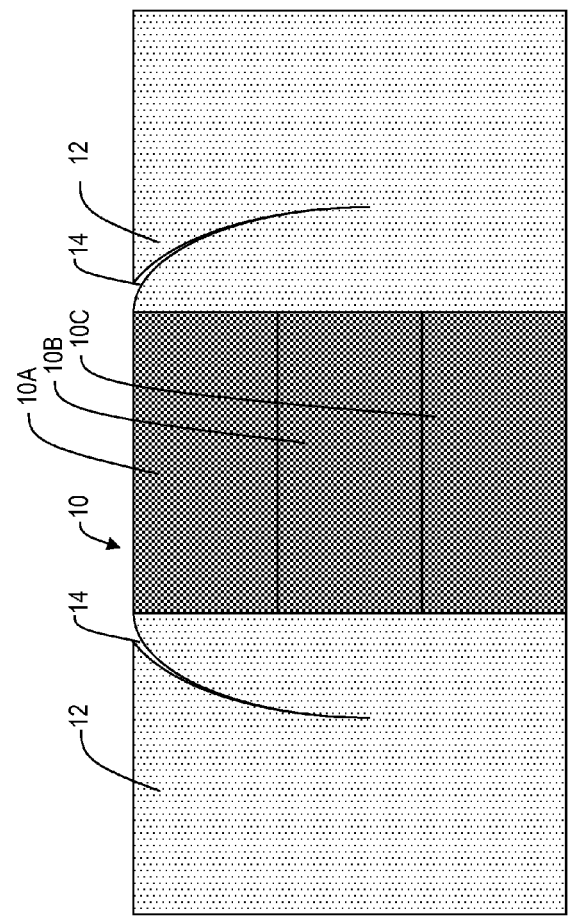
FIG. 1B is a cross sectional view of section line A-A from FIG. 1A.

FIG. 1B is a cross sectional view of section line (A-A) from FIG. 1A that illustrates the crack 14 propagating from an upper corner portion of the metal wire 10 that has damascene layers 10A, 10B and 10C.

Figure 2A:
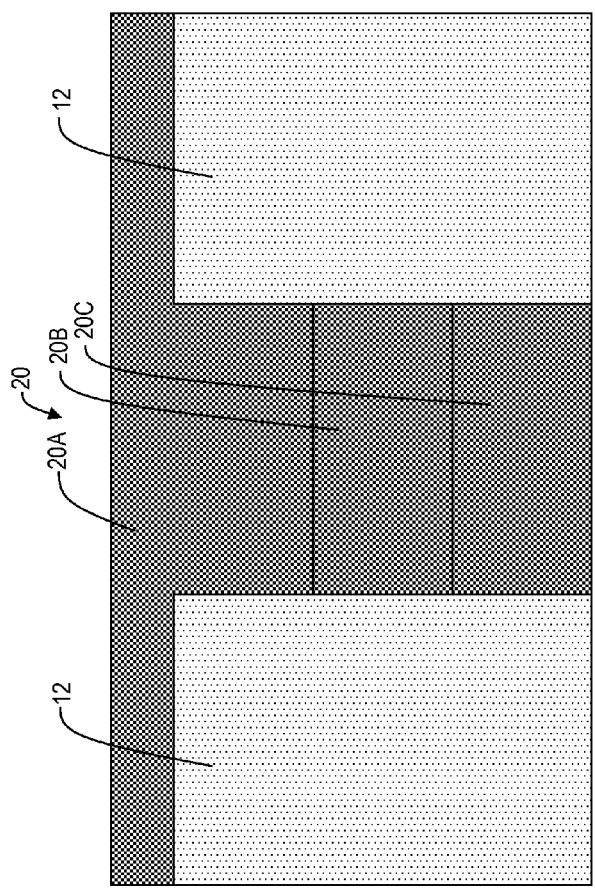
FIG. 2A is a cross sectional view of a schematic diagram of an embodiment illustrating a deposition of a portion of a non-planar damascene metal wire.

FIG. 2A is a cross sectional view of a schematic diagram of an embodiment illustrating a deposition of a portion of a non-planar damascene metal wire 20, having damascene layers 20A, 20B and 20C adjacent an insulating material 12, such as $SiO_2$. In a fabrication process, a layer of metal 20A, e.g., Cu, may be deposited on top of the insulating material 12 and any underlying metal inductor layers, e.g., 20B and 20C.

Figure 2B:
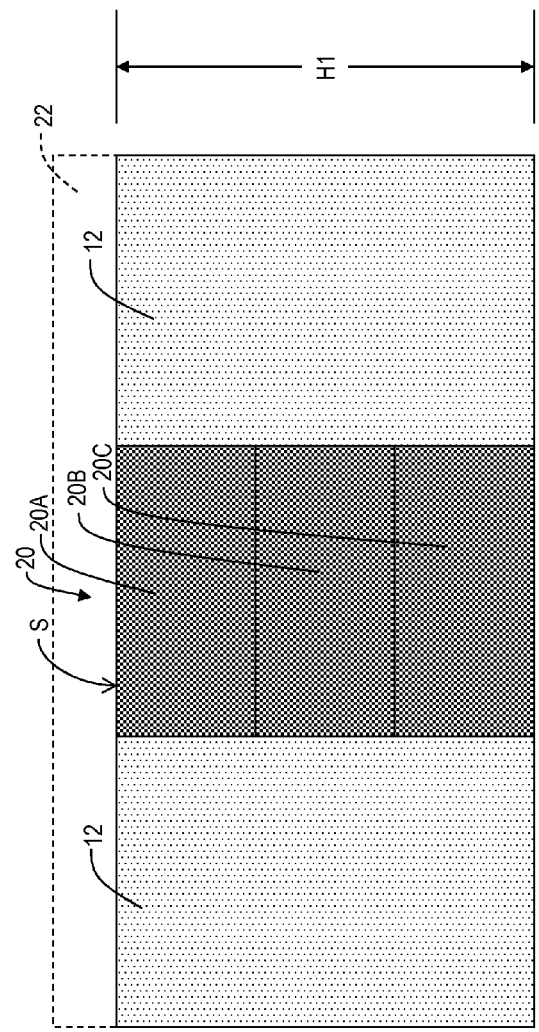
FIG. 2B is a cross sectional view of a schematic diagram of the embodiment illustrating a process of Chemical Mechanical Planarization (CMP) of a top portion of the non-planar damascene metal wire.

FIG. 2B is a cross sectional view of a schematic diagram of the embodiment illustrating a process of a hard-pad Chemical Mechanical Planarization (CMP) of a top portion of the non-planar damascene metal wire 20, such that the top portion of the metal layer 20A is removed from over the insulating material 12 as illustrated by reference number 22. The CMP process creates a uniform top surface across the metal wire 20 and the insulating material 12 as illustrated by the surface S having a first height H1.

Figure 3:
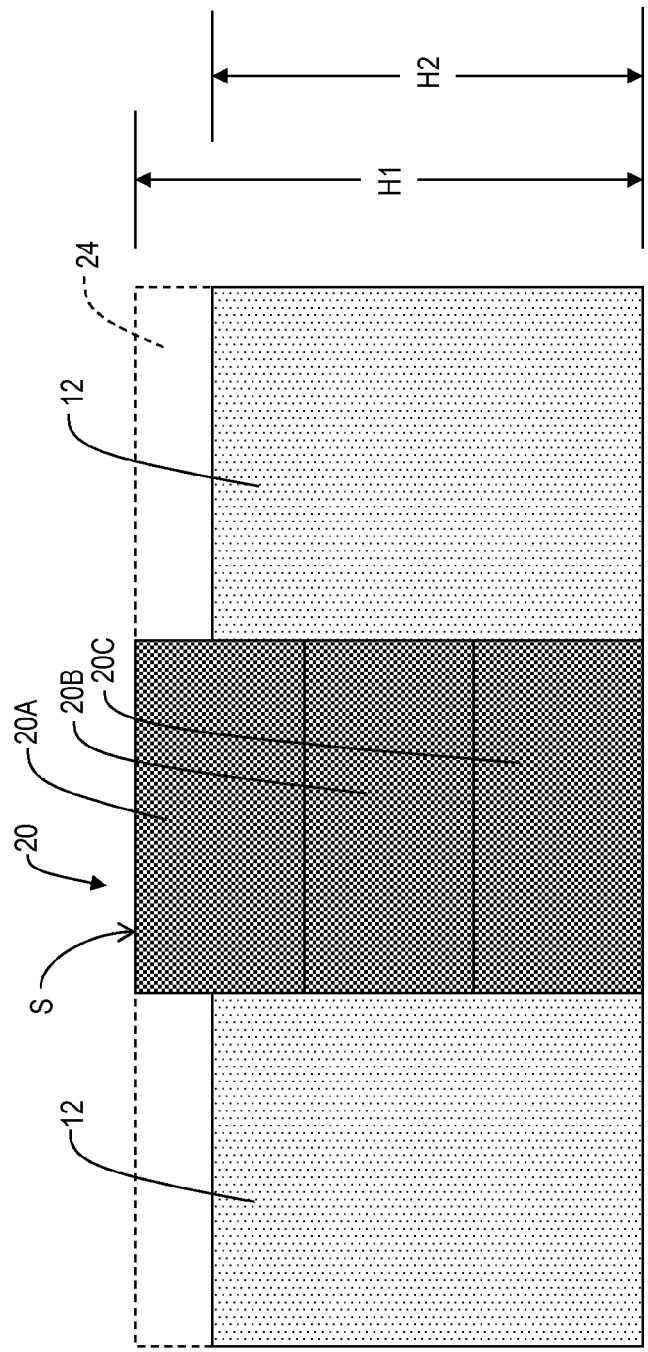
FIG. 3 is a cross sectional view of a schematic diagram of the embodiment illustrating a process of etching a portion of insulator material below the top portion of the non-planar damascene metal wire.

FIG. 3 is a cross sectional view of a schematic diagram of the embodiment illustrating a process of etching a portion 24 of the insulating material 12 below the top surface S of the non-planar damascene metal wire 20, such that only the insulating material 12 is etched to a second height H2, below that of the top surface S of the metal wire 20 at the first height H1. That is, as shown in FIG. 3, the non-planar damascene metal wire 20 remains at a height H1 and the insulating material 12 is reduced to a height H2. This etching can be performed by patterning a mask over the metal wire 20, or by performing selective etching using an etchant that does not attack metal. When patterning any material such as a mask herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

FIG. 4A is a cross sectional view of a schematic diagram of the embodiment illustrating a second process of CMP material removal of a corner portion 26 of the non-planar damascene metal wire 20 proximate the insulating material 12. The second CMP material removal process tapers the height of the corner portion 26 of the metal wire 20 such that distal edges 29 of the metal wire 20, opposite a central portion C of the metal wire 20 are removed, and the height of the metal wire 20 at the distal edges 29 is generally equivalent to the second height H2 of the etched insulating material 12 as shown in FIG. 3.

The second process of CMP material removal may be accomplished with a wet etch insulator oxide recess and soft-pad metal CMP that allows for a greater amount of material to be removed from distal edges of metal wires than a central portion of the metal wires. The second CMP process may utilize traditional copper CMP slurry, which usually combines an oxidizer such as Ferric Nitrate and an abrasive such as Icue 600 as manufactured by the Cabot Corporation in Aurora, Ill., or other copper slurries. Many types of CMP tools may be used, such as the Ebarra 222 200 mm CMP clustered tool. The CMP process itself would use a Politex polish pad as manufactured by Dow Chemicals (Semiconductor Division). CMP processing would utilize 2 to 4 Pascals of down force, with wafer rotations of 50 to 150 revolutions-per-minute (RPM), polish pad rotation speeds of 50 to 150 RPM, and polish times of 15 to 45 seconds. The process is time-limited so as to round the corners of the metal wire 20 without substantially over polishing the metal wire 20 itself.

As shown in FIG. 4A, after the second CMP material removal process, the height of the metal wire 20 at the distal edges 29 of the metal wire 20 may be substantially equivalent to the second height H2 of the insulating material 12. The upper surface S of the metal wire 20 may have a height substantially equivalent to the first height H1, or a slightly lower height H3 substantially closer in height to the first height H1 than the second height H2 due a limited amount of material removal of the metal wire 20 from the upper surface S during the second CMP process.

FIG. 4B is an alternative embodiment of the cross sectional view of FIG. 4A illustrating an alternative/magnified profile of CMP material removal of the corner portion 26 of the non-planar damascene metal wire 20 that demonstrates a roughly flat portion F proximate the central portion C of the metal wire 20 with a corner portion 26 of the metal wire removed from the distal edges 29 that creates a curved portion having a radius R between the distal edges 29 and either the flat portion F or the central portion C of the metal wire 20. The resultant radius R of the metal wire 20 eliminates any stress riser between the metal wire 20 and the more brittle insulating material 12 preventing the initiation and subsequent propagation of cracks through the insulating material 12 due to the mismatch of coefficients of thermal expansion in the adjacent materials. Thereafter, an insulating material may be deposited over the top of the metal wire 20 and the adjacent insulating material 12. preventing the initiation and subsequent propagation of cracks through the insulator material 12 due to the mismatch of coefficients of thermal expansion in the adjacent materials. Thereafter, an insulating material may be deposited over the top of the metal wire 20A and the adjacent insulator material 12.

Figures 5A, 5B:
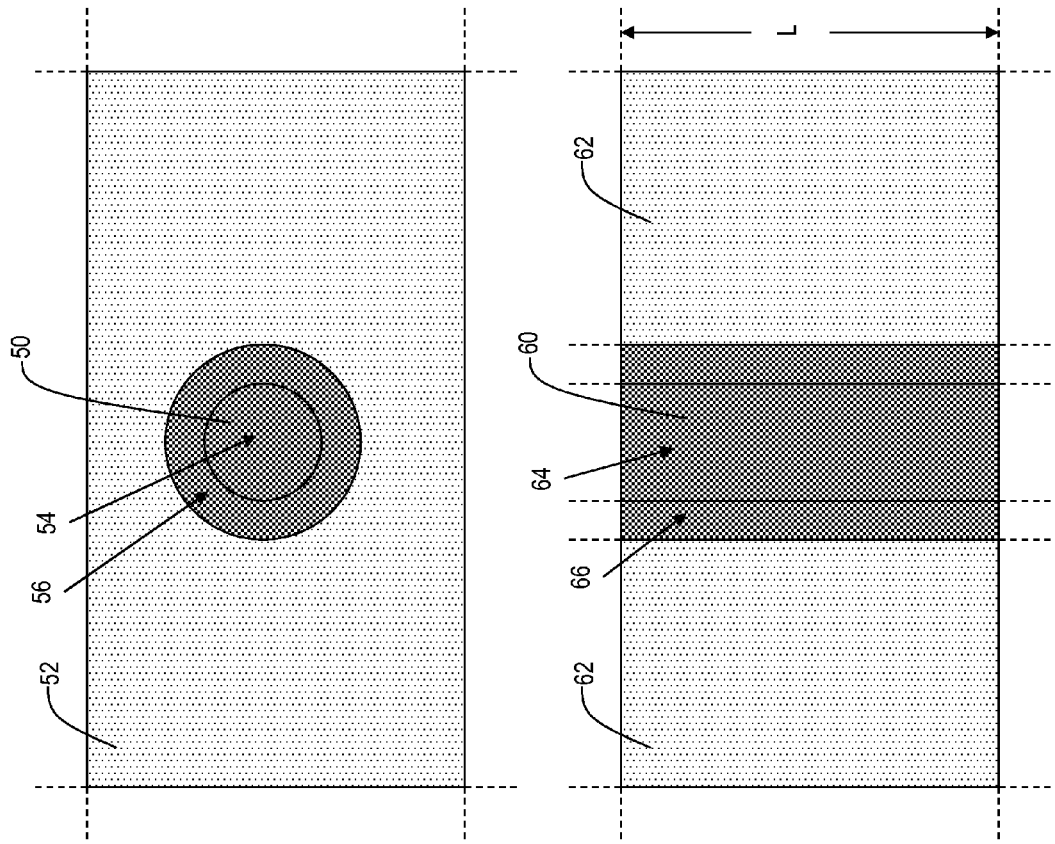
FIG. 5A is a top view of a schematic diagram of one embodiment illustrating a geometry of a non-planar damascene metal wire.
FIG. 5B is a top view of a schematic diagram of another embodiment illustrating a linear geometry of a non-planar damascene metal wire.

FIG. 5A is a top view of a schematic diagram of one embodiment illustrating a geometry of a non-planar damascene metal wire 50 that is localized at a specific point in a semiconductor being surrounded by an insulating material 52. A flat portion 54 of the metal wire 50 transitions to a radius 56 or tapered edge in the direction of the outer edge of the wire 50 at the interface of the insulating material 52.

FIG. 5B is a top view of a schematic diagram of another embodiment illustrating a non-planar damascene metal wire 60 having a linear geometry L oriented in a direction perpendicular to the metal stack of an inductor wire surrounded in the insulator material 62. A flat portion 64 of the metal wire 60 transitions to a radius 66 or tapered edge in the direction of the outer edge of the wire 60 at the interface of the insulating material 62.

Figure 6:
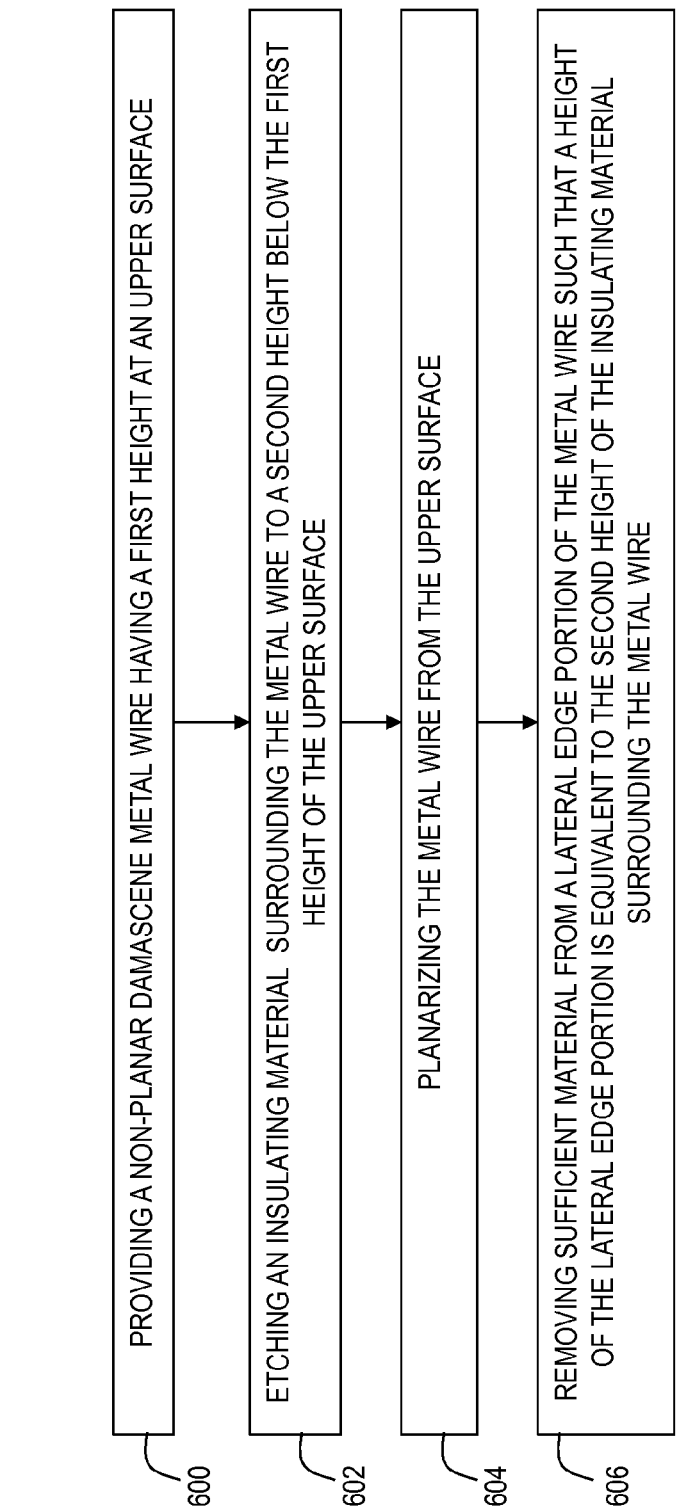
FIG. 6 a logic flowchart of a method for an embodiment described herein.

FIG. 6 is a logic flowchart of a method for an embodiment described herein where a metal wire is provided having a first height at an upper surface 600. An insulating material surrounding the metal wire is etched to a second height below the first height of the upper surface 602. The metal wire may be planarized from the upper surface, after etching the insulating material 604. Removing sufficient material from a lateral edge portion of the metal wire such that a height of the lateral edge portion is equivalent to the second height of the insulating material surrounding the metal wire 606. A central portion of the metal wire, opposite the lateral edge portion, may extends to a third height above the second height and substantially similar to the first original height.

Providing the metal wire (20) may further comprise depositing a non-planar damascene (20A, 20B, 20C) metal wire (20). The etching the insulating material (12) may further comprises etching an oxide material, e.g., $SiO_2$. The coefficient of thermal expansion of the metal wire (20) may be greater than 10 times a thermal coefficient of expansion of the insulating material (12). The planarizing may further comprise soft-pad Chemical-Mechanical Polishing (CMP), where the planarizing the metal wire provides a radius (R) at the lateral edge portion (at 26) of the metal wire (20).

An embodiment presented herein includes a structure including a metal wire (20) having a first height (H1) at a central portion (C), a second height (H2) at a first distal edge (at 29) less than the first height (H1), and a radius (R) defined from the second height (H2) at the first distal edge (at 29) to the first height (H1) at the central portion (C). Additionally, an insulating material (12) surrounds the metal wire (20) to the second height (H2) at the first distal edge (at 29) of the metal wire (20), where the first height (H1) of the metal wire (20) extends above the second height (H2) of the first distal edge (at 29) and the insulating material (12).

The metal wire (20) comprising a non-planar damascene metal wire (20A, 20B, 20C), that may include Cu. The insulating material (12) may include an oxide material, e.g., $SiO_2$. A coefficient of thermal expansion of the metal wire (20) may be greater than 10 times the coefficient of thermal expansion of the insulating material (12). The metal wire (20) may have a second distal edge (at 29) equal to the second height (H2) and a second radius (as shown in FIG. 4A) defined from the second height (H2) at the second distal edge (at 29 shown in FIG. 4A) to the first height (H1) at the central portion (C). Additionally, the non-planar damascene metal wire (20) may have a lateral length (L) perpendicular to the first height (H1), where the first distal edge (at 29) runs along the lateral length (L).

With such features, one or more embodiments herein provide a structure and method of providing the structure that produces a radius where a corner portion of a non-planar metal damascene wire used to be by a secondary soft-pad chemical mechanical planarization process to eliminate the stress riser of the sharp corner portion of the metal inductor formed though a previous fabrication process.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of wiring structures are illustrated in the drawings, those ordinarily skilled in the art would understand that many different types wiring structures could be simultaneously formed with the embodiment herein and the drawings are intended to show simultaneous formation of multiple different types of wiring structures; however, the drawings have been simplified to only show a limited number of wiring structures for clarity and to allow the reader to more easily recognize the different features illustrated. This is not intended to limit the embodiments because, as would be understood by those ordinarily skilled in the art, the embodiments herein are applicable to structures that include many of each type of structure shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   providing a metal wire within an insulating material;
   etching said insulating material to leave an exposed portion of said metal wire extending from said insulating material, said exposed portion having a central portion and distal edges; and
   polishing said exposed portion of said metal wire, after etching said insulating material, to round said distal edges of said exposed portion of said metal wire, said polishing removing corners of said exposed portion of said metal wire such that said distal edges are reduced to a level approximately equal to a surface of said insulating material after etching and leaving said central portion of said exposed portion of said metal wire extending from said insulating material, and
   said polishing comprising soft-pad Chemical-Mechanical Polishing (CMP) using between 2 to 4 Pascals of downward force, a wafer rotation between 50 to 150 revolutions-per-minute (RPM), a polish pad rotation between 50 to 150 RPM and a polish time between 15 to 45 seconds.

2. The method according to claim 1, said providing said metal wire further comprising damascene formation of said metal wire within said insulating material.

3. The method according to claim 1, said insulating material comprising an oxide material.

4. The method according to claim 1, a coefficient of thermal expansion of said metal wire being greater than 10 times a coefficient of thermal expansion of said insulating material.

5. The method according to claim 1, said polishing said exposed portion of said metal wire forming a curved portion having a radius between said distal edges and said central portion eliminating stress risers between said metal wire and said insulating material.

6. A method comprising:
   planarizing a metal wire to a first height at an upper surface;
   etching an oxide material surrounding said metal wire to a second height below said first height of said upper surface; and
   planarizing said metal wire at said upper surface, after said etching said oxide material, to remove sufficient material from a lateral edge portion of said metal wire such that a height of said lateral edge portion is equivalent to said second height of said oxide material surrounding said metal wire,
   a central portion of said metal wire, opposite said lateral edge portion, extending to a third height above said second height, said third height being one of approximately equal to said first height and between said first height and said second height, and
   said planarizing after said etching said oxide material further comprising soft-pad Chemical-Mechanical Polishing (CMP) using between 2 to 4 Pascals of downward force, a wafer rotation between 50 to 150 revolutions-per-minute (RPM), a polish pad rotation between 50 to 150 RPM and a polish time between 15 to 45 seconds.

7. The method according to claim 6, said metal wire further comprising a damascene metal wire.

8. The method according to claim 6, said etching said oxide material further comprises etching $SiO_2$.

9. The method according to claim 6, further comprising providing a thermal coefficient of expansion of said metal wire being greater than 10 times a coefficient of thermal expansion of said oxide material.

10. The method according to claim 6, said planarizing after said etching said oxide material further comprising providing a radius at said lateral edge portion of said metal wire.

11. A method comprising:
    providing a metal wire within an insulating material;
    etching said insulating material to leave an exposed portion of said metal wire extending from said insulating material; and
    after etching said insulating material, polishing said exposed portion of said metal wire for a polish time between 15 to 45 seconds using soft-pad Chemical-Mechanical Polishing (CMP) to round edges of said exposed portion of said metal wire, said polishing removing corners of said exposed portion of said metal wire and leaving said exposed portion of said metal wire extending from said insulating material.

12. The method according to claim 11, said providing said metal wire further comprising damascene formation of said metal wire within said insulating material.

13. The method according to claim 11, said insulating material comprising an oxide material.

14. The method according to claim 11, a coefficient of thermal expansion of said metal wire being greater than 10 times a coefficient of thermal expansion of said insulating material.

15. The method according to claim 11, said polishing comprising using between 2 to 4 Pascals of downward force, a wafer rotation between 50 to 150 revolutions-per-minute (RPM), and a polish pad rotation between 50 to 150 RPM.

16. The method according to claim 11, said polishing said exposed portion of said metal wire forming a curved portion having a radius between said edges and a central portion of said exposed portion.

17. A method comprising:
    planarizing a metal wire to a first height at an upper surface;
    etching an oxide material surrounding said metal wire to a second height below said first height of said upper surface; and
    after said etching said oxide material, planarizing said metal wire at said upper surface using soft-pad Chemical-Mechanical Polishing (CMP) for a polish time between 15 to 45 seconds to remove sufficient material from a lateral edge portion of said metal wire such that a height of said lateral edge portion is equivalent to said second height of said oxide material surrounding said metal wire,
    a central portion of said metal wire, opposite said lateral edge portion, extending to a third height above said second height, said third height being one of approximately equal to said first height and between said first height and said second height.

18. The method according to claim 17, said metal wire further comprising a damascene metal wire.

19. The method according to claim 17, said etching said oxide material further comprises etching $SiO_2$.

20. The method according to claim 17, further comprising providing a thermal coefficient of expansion of said metal wire being greater than 10 times a coefficient of thermal expansion of said oxide material.

21. The method according to claim 17, said planarizing after said etching further comprising using between 2 to 4 Pascals of downward force, a wafer rotation between 50 to 150 revolutions-per-minute (RPM), and a polish pad rotation between 50 to 150 RPM.

22. The method according to claim 17, said planarizing after said etching further comprising providing a radius at said lateral edge portion of said metal wire.

* * * * *